United States Patent
Tokuda

(10) Patent No.: US 11,323,080 B2
(45) Date of Patent: May 3, 2022

(54) AMPLIFICATION CIRCUIT, RADIO-FREQUENCY FRONT END CIRCUIT, AND COMMUNICATION DEVICE

(71) Applicant: Murata Manufacturing Co., Ltd., Kyoto (JP)

(72) Inventor: Masamichi Tokuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/879,930

(22) Filed: May 21, 2020

(65) Prior Publication Data

US 2020/0373890 A1 Nov. 26, 2020

(30) Foreign Application Priority Data

May 22, 2019 (JP) .............................. JP2019-096083

(51) Int. Cl.
| | |
|---|---|
| *H03F 1/22* | (2006.01) |
| *H03F 1/56* | (2006.01) |
| *H03F 3/195* | (2006.01) |
| *H03F 3/24* | (2006.01) |
| *H04B 1/04* | (2006.01) |

(52) U.S. Cl.
CPC ............ *H03F 1/565* (2013.01); *H03F 3/195* (2013.01); *H03F 3/245* (2013.01); *H04B 1/0458* (2013.01); *H03F 2200/168* (2013.01); *H03F 2200/237* (2013.01); *H03F 2200/258* (2013.01); *H03F 2200/318* (2013.01); *H03F 2200/444* (2013.01); *H03F 2200/451* (2013.01); *H03F 2200/54* (2013.01)

(58) Field of Classification Search
CPC .................................. H03F 1/22; H03F 3/191
USPC ................................................... 330/302, 311
See application file for complete search history.

(56) References Cited

U.S. PATENT DOCUMENTS

| | | | | |
|---|---|---|---|---|
| 4,835,485 A | * | 5/1989 | Mueller ............. | G01R 33/3621 330/277 |
| 5,300,897 A | * | 4/1994 | Shiga ..................... | H02H 9/045 330/207 P |
| 7,202,736 B1 | * | 4/2007 | Dow ......................... | H03F 1/14 330/129 |
| 7,355,476 B2 | * | 4/2008 | Kasha ...................... | H04B 1/18 330/284 |
| 8,354,888 B2 | * | 1/2013 | Matsuzuka ............ | H03F 3/191 330/296 |

FOREIGN PATENT DOCUMENTS

| | | |
|---|---|---|
| JP | S60-189304 A | 9/1985 |
| JP | H05-129856 A | 5/1993 |

(Continued)

*Primary Examiner* — Henry Choe
(74) *Attorney, Agent, or Firm* — Pearne & Gordon LLP

(57) ABSTRACT

An amplification circuit includes: an amplifier including a transistor that is connected between an input terminal and an output terminal; an input matching network that is connected between the input terminal and an input side of the amplifier and converts an impedance from a low impedance to a high impedance; a limiter circuit that is connected between a node between the input matching network and the input side of the amplifier, and ground and includes two diodes connected in opposite directions to each other; and a capacitor that is connected in series with the limiter circuit between the node and ground.

10 Claims, 5 Drawing Sheets

(56) References Cited

FOREIGN PATENT DOCUMENTS

| | | |
|---|---|---|
| JP | H08-31783 B2 | 3/1996 |
| JP | H09-83280 A | 3/1997 |
| JP | 2011-146843 A | 7/2011 |

* cited by examiner

US 11,323,080 B2

AMPLIFICATION CIRCUIT, RADIO-FREQUENCY FRONT END CIRCUIT, AND COMMUNICATION DEVICE

This application claims priority from Japanese Patent Application No. 2019-096083 filed on May 22, 2019. The content of this application is incorporated herein by reference in its entirety.

BACKGROUND

The present disclosure relates to an amplification circuit that amplifies a radio-frequency signal and relates to a radio-frequency front end circuit and a communication device that include the amplification circuit.

There has been disclosed a radio-frequency amplifier that includes an amplification circuit, which is formed of a field effect transistor connected between an input terminal and an output terminal, and an input matching network that is connected to the input terminal (for example, refer to Japanese Unexamined Patent Application Publication No. 2011-146843).

In addition, there has been disclosed a limiter circuit that includes two diodes connected in opposite directions from each other (for example, refer to Japanese Unexamined Patent Application Publication No. 9-83280).

By connecting the limiter circuit disclosed in Japanese Unexamined Patent Application Publication No. 9-83280 to the input terminal of the radio-frequency amplifier disclosed in Japanese Unexamined Patent Application Publication No. 2011-146843, it is possible to suppress input of an excessive voltage to the radio-frequency amplifier and to suppress generation of distortion in an output signal of the radio-frequency amplifier.

However, with the recent use of higher frequencies in various devices, it has become increasingly common to use a step-up input matching network, which converts an impedance from a low impedance to a high impedance, as an input matching network. In this case, when a limiter circuit is arranged in front of an input matching network (on the opposite side of the input matching network from the radio-frequency amplifier), a voltage that has been limited by the limiter circuit is stepped up by the input matching network and consequently it may not be possible to adequately limit input of an excessive voltage to the radio-frequency amplifier and prevent the radio-frequency amplifier from being damaged.

BRIEF SUMMARY

Accordingly, the present disclosure provides an amplification circuit and so forth that can effectively suppress input of an excessive voltage to an amplifier when a step-up input matching network is used.

An embodiment of the present disclosure provides an amplification circuit that includes: an amplifier including a transistor that is connected between an input terminal and an output terminal; an input matching network that is connected between the input terminal and an input side of the amplifier and converts an impedance from a low impedance to a high impedance; a limiter circuit that is connected between a node between the input matching network and the input side of the amplifier, and ground and includes two diodes connected in opposite directions to each other; and a first capacitor that is connected in series with the limiter circuit between the node and ground.

An embodiment of the present disclosure provides a radio-frequency front end circuit that includes: a filter; a switch that is directly or indirectly connected to the filter; and the above-described amplification circuit that is directly or indirectly connected to the filter.

An embodiment of the present disclosure provides a communication device that includes: an RF signal processing circuit that processes a radio-frequency signal transmitted or received by an antenna element; and the above-described radio-frequency front end circuit, which transmits the radio-frequency signal between the antenna element and the RF signal processing circuit.

According to the embodiments of the present disclosure, input of an excessive voltage to an amplifier can be effectively suppressed in the case where a step-up input matching network is used.

Other features, elements, characteristics and advantages of the present disclosure will become more apparent from the following detailed description of embodiments of the present disclosure with reference to the attached drawings.

DETAILED DESCRIPTION

Background to Embodiment of Present Disclosure

The background to an embodiment of the present disclosure will be described using FIG. 1.

Figure 1:
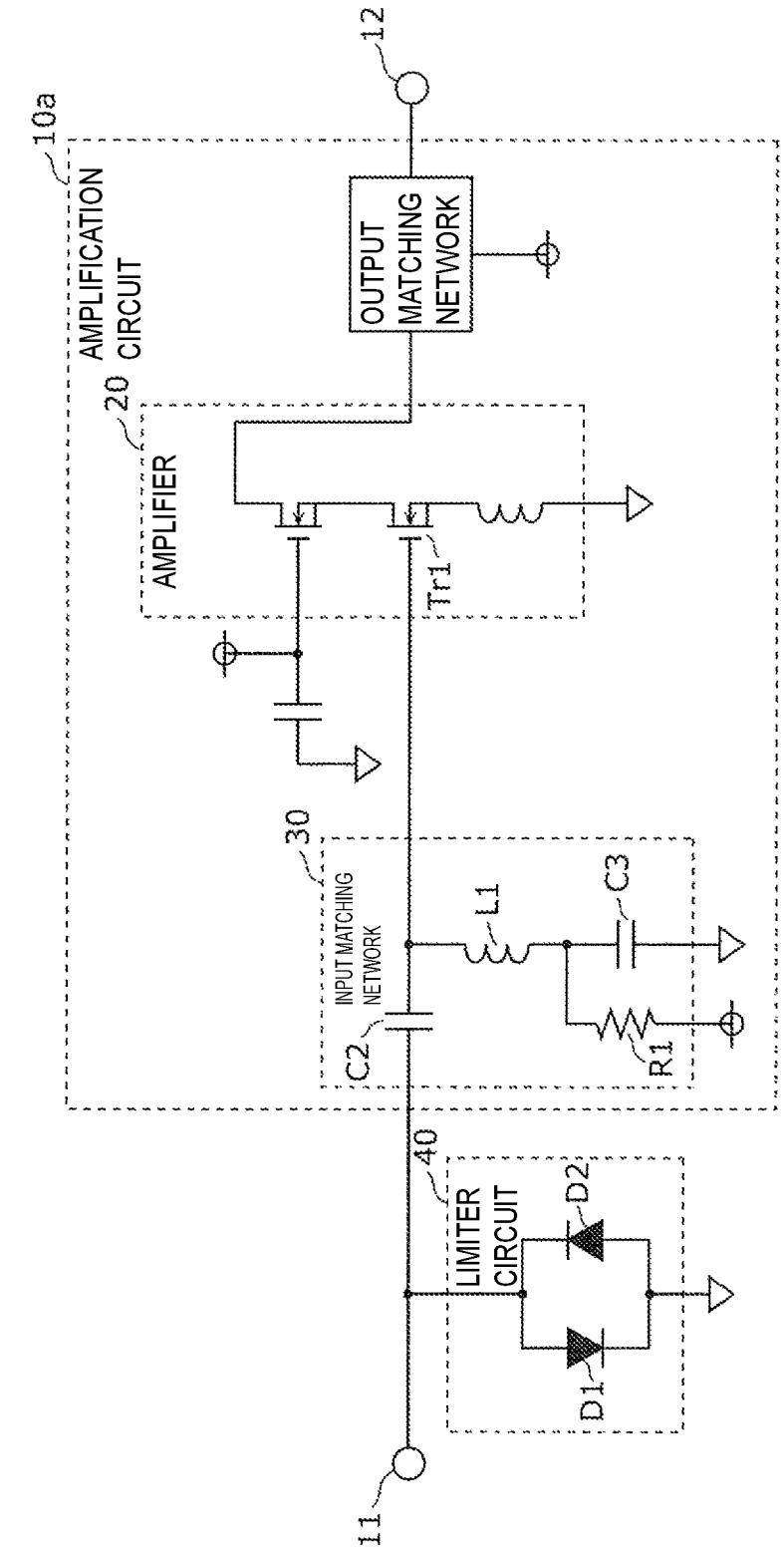
FIG. 1 is a circuit configuration diagram illustrating an example of an amplification circuit according to a comparative example.

FIG. 1 is a circuit configuration diagram illustrating an example of an amplification circuit 10a according to a comparative example. In FIG. 1, components that are identical to those of an amplification circuit 10 according to embodiment 1, which will be described later, are denoted by identical symbols and these components will be described in detail later.

In accordance with the recent use of higher frequencies in various devices, a step-up input matching network 30, which converts an impedance from a low impedance to a high impedance, is used in the amplification circuit 10a. In addition, a limiter circuit 40 is used in order to suppress input of an excessive voltage to an amplifier 20. The limiter circuit 40 is connected between ground and a node between an input terminal 11 and the input matching network 30. The limiter circuit 40 can limit a signal voltage to a voltage amplitude regulated by the forward voltages of diodes D1 and D2 (for example, from 0.4 to 0.7 V). However, since a voltage that has been limited by the limiter circuit 40 is then stepped up by the step up input matching network 30, it may not be possible to adequately suppress input of an excessive voltage to the amplifier 20 and the amplifier 20 may be damaged.

Regarding this point, it is feasible to connect the limiter circuit 40 between ground and a node between the input matching network 30 and the input side of the amplifier 20. However, in general, it is often the case that the amplifier 20 will be used by supplying a bias voltage to the input side of the amplifier 20 in order to optimize the operation point of the amplifier 20, and if the limiter circuit 40 is connected between the node and ground, the bias voltage will also be input to the limiter circuit 40. Therefore, the operation of one diode of the limiter circuit 40 will be offset by the bias voltage, and therefore the operation of the limiter circuit 40 will be asymmetrical with respect to a positive direction voltage amplitude and a negative direction voltage amplitude. In other words, even in the case where the limiter circuit 40 is connected between ground and a node between the input matching network 30 and the input side of the amplifier 20, distortion may be generated in an output signal of the amplifier 20 due to the asymmetry of the operation of the limiter circuit 40.

Hereafter, description will be given of an amplification circuit and the like that can effectively suppress input of an excessive voltage to the amplifier 20 in the case where the step-up input matching network 30 is used.

Hereafter, embodiments of the present disclosure will be described in detail using the drawings. The embodiments described hereafter each illustrates a comprehensive or specific example of the present disclosure. The numerical values, shapes, materials, constituent elements, arrangement of the constituent elements, the ways in which the constituent elements are connected to each other and so forth given in the following embodiments are merely examples and are not intended to limit the present disclosure. Constituent elements not described in the independent claims among constituent elements in the following embodiments are described as arbitrary constituent elements. Furthermore, in the drawings, components that are substantially the same as each other are denoted by the same symbols and repeated description thereof may be omitted or simplified. In addition, in the following embodiments, "connected" is not limited to only the case of being directly connected and also includes the case of being electrically connected via another element or the like.

Embodiment 1

An amplification circuit according to embodiment 1 will be described while referring to FIGS. 2 and 3.

Figure 2:
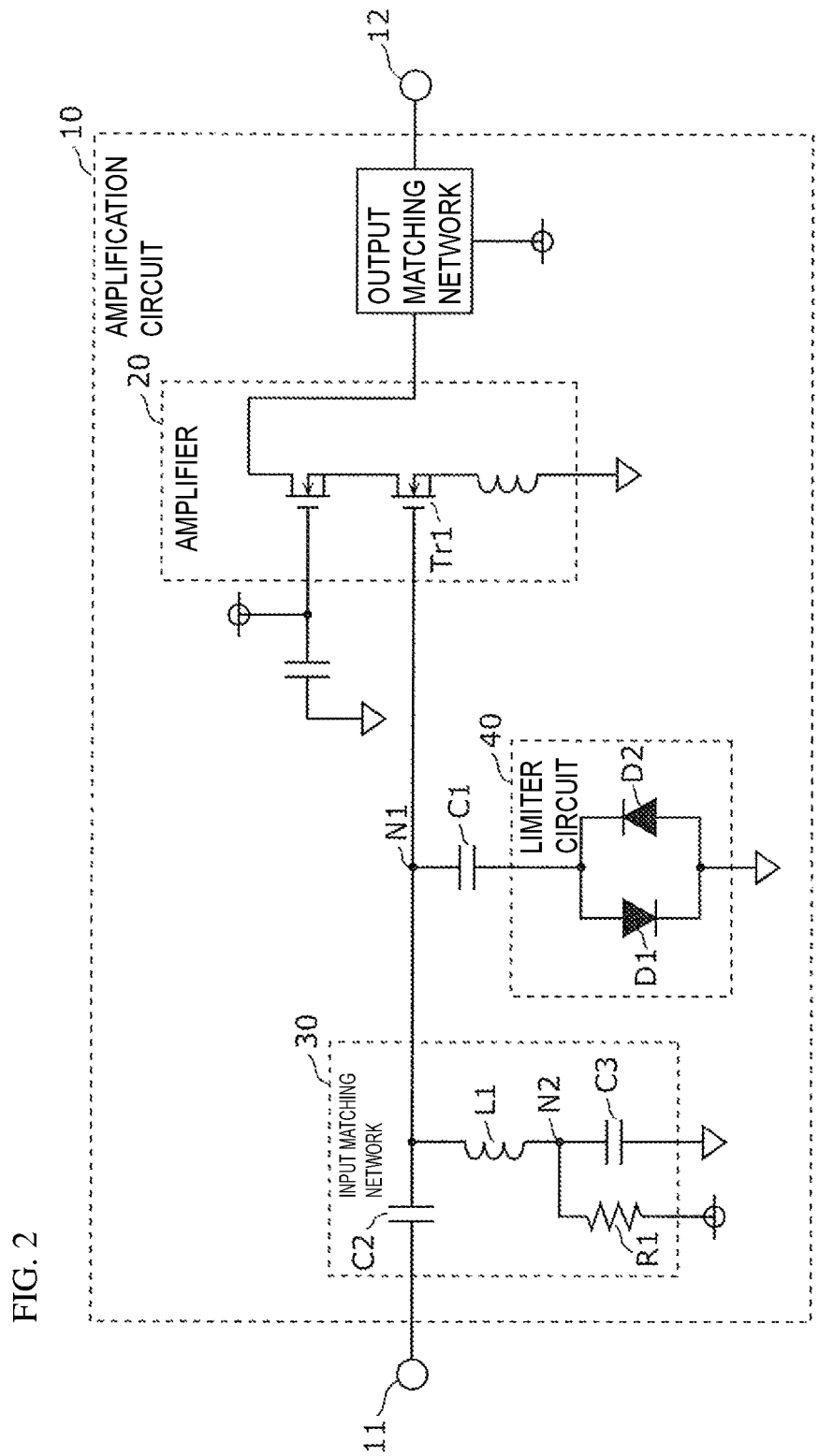
FIG. 2 is a circuit configuration diagram illustrating an example of an amplification circuit according to embodiment 1.

FIG. 2 is a circuit configuration diagram illustrating an example of an amplification circuit 10 according to embodiment 1.

The amplification circuit 10 is a circuit that is for amplifying a radio-frequency signal and is for example a low noise amplifier (LNA). The operation band of the amplification circuit 10 is for example the frequency band of a 5 GHz band wireless local area network (LAN).

The amplification circuit 10 includes an amplifier 20, an input matching network 30, a limiter circuit 40, and a capacitor C1. The amplification circuit 10 contains other constituent elements in addition to these constituent elements, but only the constituent elements related to the characteristic parts of the present disclosure are denoted by reference symbols and will be described here and detailed description of other constituent elements not denoted by reference symbols will be omitted.

The amplifier 20 is a circuit that amplifies a signal input thereto and outputs the amplified signal. It is necessary to ensure that an excessive voltage is not input to the amplifier 20, but there may be a risk of an excessive voltage being input to the amplifier 20 in the system or device in which the amplifier 20 is used.

The amplifier 20 is a circuit that includes a transistor Tr1 connected between an input terminal 11 and an output terminal 12. Here, the amplifier 20 has a configuration in which two transistors are cascode connected with each other. The transistor Tr1 is for example an N-channel metal oxide semiconductor field effect transistor (MOSFET) and forms a common-source amplifier. The transistor Tr1 may instead be a bipolar transistor. Furthermore, the transistor Tr1 is not limited to forming a common-source (emitter) amplifier and may instead form a common-gate (base) amplifier.

It is easy to make the input impedance high when the amplifier 20 has a cascode connection configuration or is a common-source amplifier using a MOSFET. Consequently, it is easy to limit the voltage input to the amplifier 20 by utilizing impedance conversion in the input matching network 30, which will be described later, i.e., it is easy to suppress input of an excessive voltage to the amplifier 20.

The input matching network 30 is a circuit that is connected between the input terminal 11 and the input side of the amplifier 20 (specifically the gate of the transistor Tr1) and converts an impedance from a low impedance to a high impedance. Specifically, the input matching network 30 includes a capacitor C2 and an inductor L1. The capacitor C2 is a second capacitor that is arranged on a path connected between the input terminal 11 and a node N1 between the input matching network 30 and the input side of the amplifier 20. The inductor L1 is a first inductor connected between the node N1 and ground. The meaning of "node" includes not only one point on a path but also two different points on a path with no elements arranged therebetween. In other words, a connection point between the capacitor C2 and the inductor L1 inside the input matching network 30 in the circuit diagram in FIG. 2 is also regarded as the node N1.

Thus, the input matching network 30 can be realized that converts an impedance from a low impedance to a high impedance using the capacitor C2 as a series capacitor and the inductor L1 as a shunt inductor. In addition, the input matching network 30 can form a high pass filter (HPF), and therefore an unwanted low-frequency signal can be suppressed and degradation of the reception sensitivity of the amplification circuit 10 can be suppressed. In this embodiment, the operation band of the amplification circuit 10 is for example a 5 GHz band, but unwanted signals of a 600 MHz to 3.8 GHz band including the frequency band of a mobile phone, the frequency band of a wireless local area network (LAN), and so forth may be input to the input terminal 11. Such an unwanted low-frequency signal can be suppressed by the HPF-type input matching network 30 and a signal of the operation band of the amplification circuit 10 can be extracted and amplified by the amplifier 20.

Furthermore, as a result of the input matching network 30 being a HPF-type matching network, the capacitance of the capacitor C2 can be made smaller than that of a DC cut capacitor normally used in a 50Ω characteristic impedance system. In other words, the capacitor C2 can be made smaller. Furthermore, as a result of the capacitance of the capacitor C2 being small, it is possible to reduce the time constant of an RC circuit (circuit consisting of resistor R1, capacitors C1, C2, and C3 and so on) formed on the input side of the amplifier 20 when a bias voltage, which will be described later, is supplied to the input side of the amplifier 20 and it is possible to shorten the time from when the bias voltage is applied until when the amplification circuit 10 begins operating.

The input matching network 30 further includes a capacitor C3. The capacitor C3 is a third capacitor that is connected in series with the inductor L1 between the inductor L1 and ground. A series resonant circuit is formed by the inductor L1 and the capacitor C3.

The series resonant circuit formed of the inductor L1 and the capacitor C3 can function as a band elimination filter (BEF) and therefore a signal of a prescribed frequency (for example, a signal having a frequency lower than the operation band of the amplification circuit 10) can be suppressed and degradation of the reception sensitivity of the amplification circuit 10 can be suppressed. For example, the effect of the second harmonic wave of the 2.4 GHz band, which is the desired frequency, on the 5 GHz band signal can be suppressed. Furthermore, since the capacitor C3 has a low impedance in a radio-frequency band, a radio-frequency signal is reflected, leakage of the radio-frequency signal is suppressed, and deterioration of the noise figure (NF) of the amplification circuit 10 can be suppressed. In addition, compared with the case where a BEF is provided separately, the amplification circuit 10 can be reduced in size by forming the BEF in the input matching network 30.

For example, the resonant frequency of the series resonant circuit formed of the inductor L1 and the capacitor C3 is located at a lower frequency than the operation band of the amplification circuit 10.

Thus, an unwanted low-frequency signal can be further suppressed by the series resonant circuit.

In addition, the resonant frequency of the series resonant circuit is a frequency that is higher than a frequency that is half the frequency of the operation band of the amplification circuit 10. The series resonant circuit is a circuit that is for suppressing an unwanted signal of the 2.4 GHz band for example, and the resonant frequency of the series resonant circuit is around 2.7 GHz, which is higher than 2.4 GHz. The effect achieved by making the resonant frequency of the series resonant circuit slightly higher than the frequency that is to be suppressed will be explained using FIG. 3.

Figure 3:
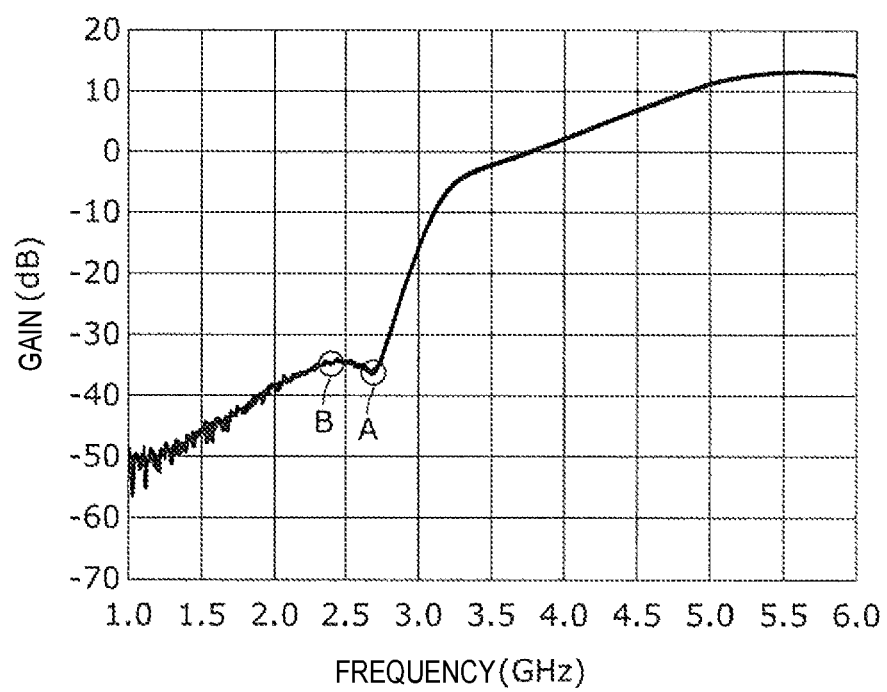
FIG. 3 is a graph illustrating the gain-frequency characteristic of the amplification circuit according to embodiment 1.

FIG. 3 is a graph illustrating the gain-frequency characteristic of the amplification circuit 10 according to embodiment 1.

The input matching network 30 used as a HPF has a gently sloping attenuation characteristic and therefore there is a tendency for the attenuation in a frequency band at a frequency around half that of the operation band (5 GHz band) of the amplification circuit 10 to be relatively insufficient. Specifically, as illustrated in FIG. 3, although the gain of the amplification circuit 10 at frequencies lower than the 5 GHz band is reduced by the HPF-type input matching network 30, the gain is not sharply reduced. Therefore, there may be an effect due to an unwanted harmonic wave (second harmonic wave) of a frequency band (for example, 2.4 GHz band) that is at a frequency half that of the operation band of the amplification circuit 10.

Regarding this point, the resonant frequency (attenuation pole of BEF) of the series resonant circuit is made to be higher than a frequency that is half that of the operation band of the amplification circuit 10. For example, the attenuation pole of the BEF is made to be 2.7 GHz as indicated by part A in FIG. 3. Here, in the case where an unwanted wave of a frequency band that is at a frequency half that of the operation band of the amplification circuit 10 is to be suppressed, it is feasible to position the BEF attenuation pole close to a frequency that is half that of the operation band of the amplification circuit 10, for example, a 2.4 GHz band as indicated by part B in FIG. 3. However, the attenuation on the high-frequency side of the attenuation pole is likely to be insufficient and when there are variations in the position of the BEF attenuation pole, it may not be possible to sufficiently suppress the unwanted wave. As illustrated in FIG. 3, the attenuation at frequencies higher than the position of the attenuation pole (part A) is insufficient and when the position of the attenuation pole is shifted toward the low-frequency side from the desired frequency, the attenuation at the desired frequency will be insufficient. On the other hand, it is clear that there is not a large change in the amount of attenuation at frequencies lower than the position of the attenuation pole. Accordingly, an unwanted wave in a frequency band that is at a frequency half that of the operation band of the amplification circuit 10 can be reliably suppressed even when the position of the attenuation pole varies by setting the position of the BEF attenuation pole to be a frequency that is higher than a frequency half that of the operation band of the amplification circuit 10 by a certain amount (for example, around 10%) in advance.

A node N2 between the inductor L1 and the capacitor C3 serves as a bias terminal. In other words, while functioning as a matching network, the input matching network 30 also functions as a bias circuit as a result of a bias voltage being supplied to the node N2. When a bias voltage is supplied to the bias terminal, the capacitor C2 of the input matching network 30 not only functions as part of the matching network and the HPF but also functions as a DC cut capacitor that stops the bias voltage supplied to the bias terminal from being input to the input terminal 11.

Thus, the input matching network 30 can also be used as a bias circuit by using a node between inductor L1 and the capacitor C3 as a bias terminal. Therefore, the number of circuit elements can be reduced and NF can be suppressed. In addition, the amplification circuit 10 can be reduced in size compared with the case where the bias circuit is separately provided.

A bias voltage is supplied to the bias terminal (node N2) via a resistor or an inductor. Here, the bias voltage is supplied via the resistor R1. The resistance of the resistor R1 is 1 kΩ, for example. Generally, a resistor having a relatively high resistance (for example, 10 kΩ) is used to supply the bias voltage. If a resistor having a low resistance is used, the radio-frequency signal will leak toward the supply source of the bias voltage and it would be likely that the NF of the amplification circuit 10 will deteriorate. In contrast, in this embodiment, the bias voltage can be supplied via the input matching network 30 having a high impedance by utilizing the capacitor C1, which is described later, and leaking of a radio-frequency signal to the supply source of the bias voltage can be suppressed without necessarily increasing the resistance of the resistor R1 used to the supply the bias voltage by a large amount. Therefore, leaking of a radio-frequency signal to the supply source of the bias voltage is suppressed by the input matching network 30 (specifically, the inductor L1) having a high impedance while suppressing power consumption by using the resistor R1 having a small resistance and degradation of the NF of the amplification circuit 10 can be suppressed.

The limiter circuit 40 is a circuit that is connected between ground and the node N1 between the input matching network 30 and the input side of the amplifier 20 and includes two diodes D1 and D2 that are connected in opposite directions to each other. The limiter circuit 40 can limit a signal voltage to a voltage amplitude regulated by the forward voltages of diodes D1 and D2 (for example, from 0.4 to 0.7 V). Specifically, a diode to which a forward voltage is applied enters a conductive state and can limit voltages exceeding the forward voltage. In other words, the limit voltage of the limiter circuit 40 is the forward voltage of the diodes D1 and D2. In addition, another diode may be serially connected to each of the diodes D1 and D2 and the limit voltage of the limiter circuit 40 may be adjusted in accordance with the number of serially connected diodes. The limiter circuit 40 may be realized using diode-connected MOSFETs or diode-connected bipolar transistors.

The input matching network 30, which converts an impedance from a low impedance to a high impedance, performs an operation of stepping up the voltage in the operation band (radio-frequency band) of the amplification circuit 10. Therefore, when the limiter circuit 40 is arranged in front of the thus-configured input matching network 30 as illustrated in FIG. 1 (on opposite side of input matching network 30 from amplifier 20), a voltage that has been limited by the limiter circuit 40 is stepped up by the input matching network 30. In contrast, it is possible to appropriately limit a voltage stepped up by the input matching network 30 using the limiter circuit 40 before the voltage is input to the amplifier 20 by connecting the limiter circuit 40 between ground and the node N1 between the input matching network 30 and the input side of the amplifier 20. As a result, input of an excessive voltage to the amplifier 20 can be suppressed and generation of harmonic waves, particularly odd harmonic waves, and generation of intermodulation distortion caused by saturation of the amplifier 20 due to an excessively large input can be suppressed. Additionally, it is possible to suppress damage to the amplifier 20 caused by input of an excessive voltage.

However, as described above, in general, it is often the case that the amplifier 20 is used by supplying a bias voltage to the input side thereof and the bias voltage is then also input to the limiter circuit 40 due to the limiter circuit 40 being simply connected between the node N1 and ground. In other words, when the bias voltage is also input to the limiter circuit 40, the operation of one diode of the limiter circuit 40 is offset by the bias voltage, and therefore the operation of the limiter circuit 40 is asymmetrical with respect to a positive direction voltage amplitude and a negative direction voltage amplitude.

Accordingly, the amplification circuit 10 is provided with the capacitor C1. The capacitor C1 is a first capacitor that is serially connected to the limiter circuit 40 between the node N1 and ground. The capacitor C1 is serially connected to the limiter circuit 40 between the node N1 and the limiter circuit 40, but may instead be serially connected to the limiter circuit 40 between the limiter circuit 40 and ground. The capacitance of the capacitor C1 is selected so that the capacitor C1 has a low impedance in the operation band of the amplification circuit 10.

Thus, the input of the bias voltage to the limiter circuit 40 can be stopped by the capacitor C1. Therefore, the situation in which the operation of the limiter circuit 40 is asymmetrical with respect to a positive direction voltage amplitude and a negative direction voltage amplitude can be suppressed and generation of harmonic waves, particularly even harmonic waves, can be suppressed.

Furthermore, since the capacitor C1, which stops the bias voltage from being input to the limiter circuit 40, is not arranged on a path connected between the input matching network 30 and the input side of the amplifier 20, the bias voltage can be supplied to the amplifier 20 without necessarily being interrupted by the capacitor C1 on that path even when the bias voltage is applied via the input matching network 30. Therefore, the bias voltage can be supplied via the input matching network 30 having a high impedance, and as described above, the resistance of the resistor R1 used in supplying of the bias voltage can be reduced.

Furthermore, the impedance of the amplification circuit 10 in a desired frequency band is increased by the HPF-type input matching network 30 and the capacitance of the limiter circuit 40 consists of the parallel capacitance of the diodes D1 and D2 and the series capacitance of the capacitor C1. Here, when the bias voltage is supplied to the input side of the amplifier 20, the time constant of the RC circuit (circuit consisting of resistor R1, capacitance of limiter circuit 40 (parallel capacitance of diodes D1 and D2), capacitors C2 and C3, and so on), which is formed on the input side of the amplifier 20, can be reduced and the time from when the bias voltage is applied until when the amplification circuit 10 begins operating can be shortened.

For example, the limit voltage of the limiter circuit 40 (specifically, the forward voltage of the diodes D1 and D2) is greater than or equal to the bias voltage supplied to the bias terminal.

Thus, when the bias voltage is supplied, the diodes D1 and D2 of the limiter circuit 40 do not enter a conductive state. The parallel capacitance of the diodes D1 and D2 of the limiter circuit 40 is usually smaller than the capacitance of the capacitor C1 connected in series with the limiter circuit 40, and therefore the parallel capacitance of the limiter circuit 40 can be made much smaller than the capacitance of the capacitor C1. In other words, in the RC circuit (circuit consisting of resistor R1, capacitance of limiter circuit 40 (parallel capacitance of diodes D1 and D2), the capacitors C2 and C3, and so on) formed on the input side of the amplifier 20, the time constant of the RC circuit can be reduced and the time from when the bias voltage is applied until when the amplification circuit 10 begins operating can be shortened.

Furthermore, the value of the bias voltage supplied to the bias terminal is variable. Specifically, it is possible to switch between supplying the bias voltage to the bias terminal and stopping supply of the bias voltage to the bias terminal. For example, supplying and stopping of the bias voltage to the bias terminal may be performed by a radio frequency integrated circuit (RFIC), which will be described later.

When the bias voltage does not need to be supplied, the bias voltage can be stopped, so that the power consumption can be reduced. Furthermore, even when switching between stopping and supplying of the bias voltage to the bias terminal is performed, in this embodiment, as described above, the time constant of the RC circuit formed on the input side of the amplifier 20 can be reduced and therefore it is possible to shorten the time from when the bias voltage is applied until when the amplification circuit 10 begins operating.

The value of the bias voltage may be adjusted and supplied to the bias terminal and the operation point of the amplifier 20 may be adjusted.

For example, the circuit elements and wiring lines in the amplification circuit 10 are formed on a silicon-on-insulator (SOI) substrate and realized as a small-sized IC. The amplification gain can be increased due to low conductor loss, the suppression performance of unwanted signals by the BEF and the HPF can be improved, and the NF of the amplification circuit 10 can be reduced by using copper or a copper alloy as a main constituent of the inductors, the capacitors, and the wiring lines. The inductors, the capacitors, and the wiring lines may be formed by combining copper or a copper alloy and another metal mainly consisting of aluminum or an aluminum alloy. The circuit elements and wiring lines in the amplification circuit 10 may be formed on a silicon substrate or a GaAs substrate. Furthermore, the circuit elements and wiring lines in the amplification circuit 10 may be formed on a printed circuit board and some or all of the circuit elements may be realized as individual electronic components.

As described above, input of an excessive voltage to the amplifier 20 can be effectively suppressed even in the case where the step-up input matching network 30 is used by connecting the limiter circuit 40 between ground and the node N1 between the input matching network 30 and the input side of the amplifier 20 rather than connecting the limiter circuit 40 in front of (on the opposite side of the input matching network 30 from the amplifier 20) the input matching network 30, and connecting the capacitor C1 in series with the limiter circuit 40 between the node N1 and ground.

In embodiment 1, it has been described that the operation band of the amplification circuit 10 is 5 GHz for example, but the operation band is not limited to this example. The operation band may instead be the 2.4 GHz band, which was described as the frequency band of an unwanted signal in embodiment 1. An amplification circuit according to a modification of embodiment 1 in which the operation band of the amplification circuit is the 2.4 GHz band will be described using FIG. 4.

Figure 4:
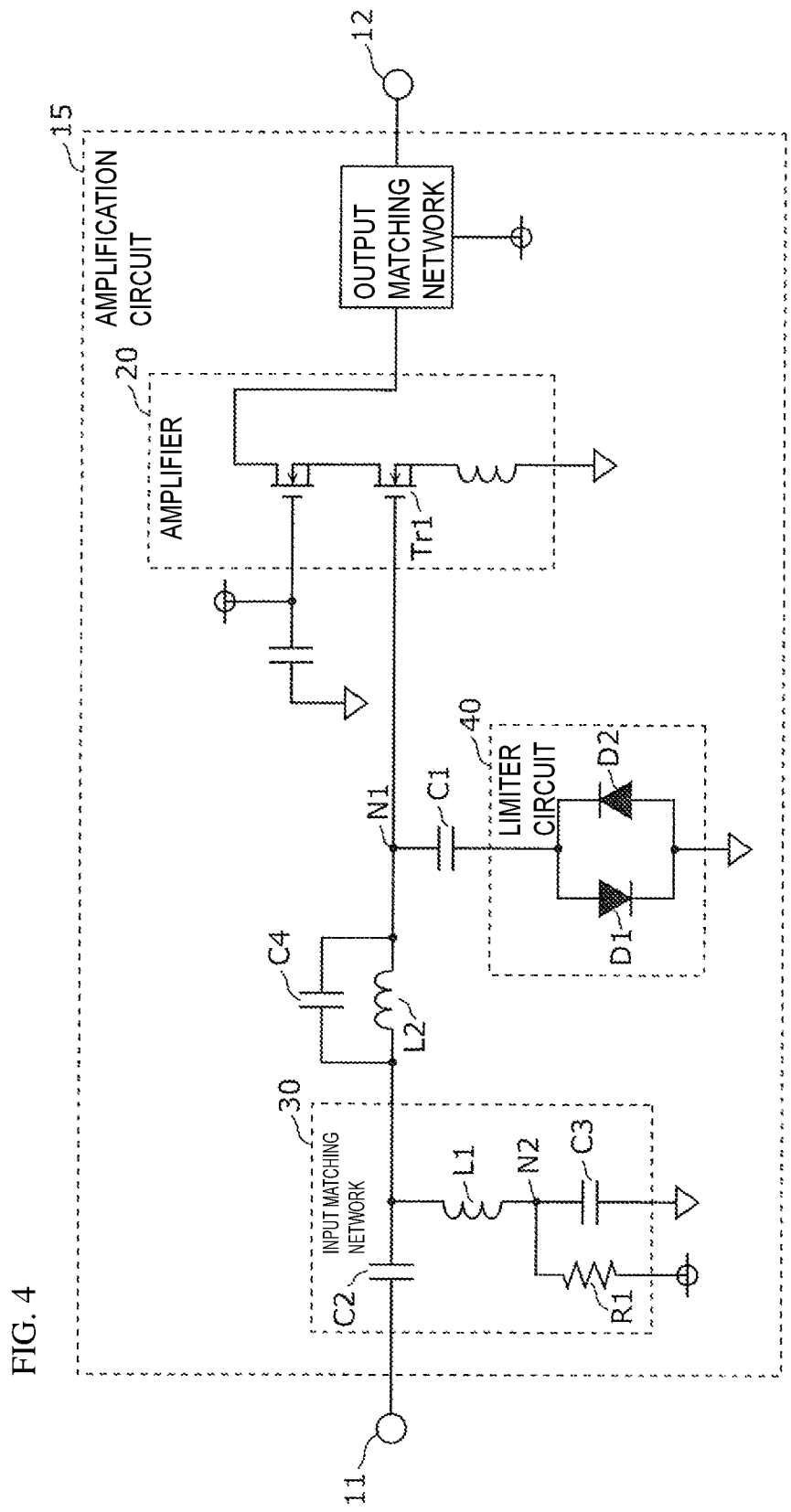
FIG. 4 is a circuit configuration diagram illustrating an example of an amplification circuit according to a modification of embodiment 1.

FIG. 4 is a circuit configuration diagram illustrating an example of an amplification circuit 15 according to a modification of embodiment 1.

The amplification circuit 15 differs from the amplification circuit 10 according to embodiment 1 in that the amplification circuit 15 further includes a parallel resonant circuit in which an inductor L2 and a capacitor C4 are connected in parallel with each other. The rest of the configuration is the same as in embodiment 1 and therefore description thereof will not be omitted.

The inductor L2 and the capacitor C4 are a second inductor and a fourth capacitor that are arranged along a path connected between the input matching network 30 and the node N1. A parallel resonant circuit is formed by the inductor L2 and the capacitor C4.

The parallel resonant circuit formed of the inductor L2 and the capacitor C4 can function as a BEF and therefore a signal of a desired frequency (for example, a signal having a frequency higher than the operation band of the amplification circuit 15) can be suppressed and degradation of the reception sensitivity of the amplification circuit 15 can be suppressed. For example, it is possible to suppress the effect of a signal of the 5 GHz band, as the desired frequency, on a signal the 2.4 GHz band signal.

Embodiment 2

The amplification circuit 10 or 15 described in embodiment 1 can be used in a radio-frequency front end circuit or a communication device. A radio-frequency front end circuit and a communication device including the amplification circuit 10 according to embodiment 1 will be described using FIG. 5.

Figure 5:
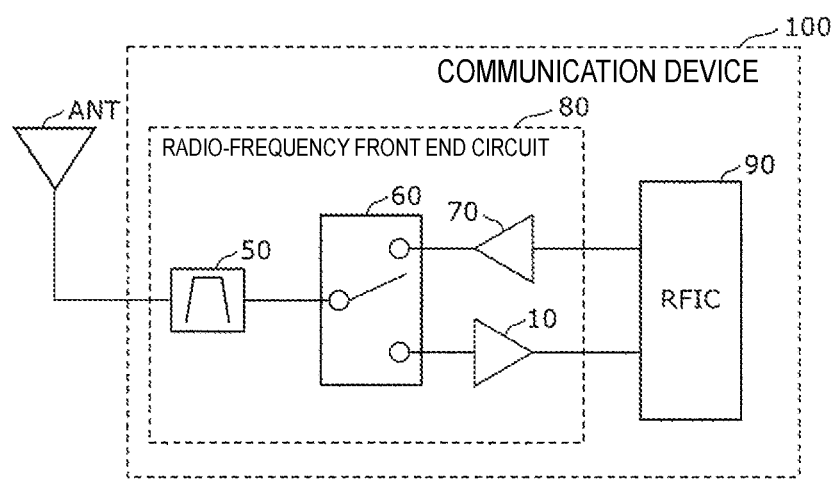
FIG. 5 is a circuit configuration diagram illustrating an example of a communication device according to embodiment 2.

FIG. 5 is a circuit configuration diagram illustrating an example of a communication device 100 according to embodiment 2.

As illustrated in FIG. 5, the communication device 100 includes a radio-frequency front end circuit 80 and an RF signal processing circuit (RFIC) 90. In addition, an antenna element ANT is illustrated in FIG. 5. The antenna element ANT may be built into the communication device 100.

The radio-frequency front end circuit 80 is a circuit that transmits a radio-frequency signal between the antenna element ANT and the RFIC 90. Specifically, the radio-frequency front end circuit 80 transmits a radio-frequency signal received by the antenna element ANT to the RFIC 90 and transmits a radio-frequency signal output from the RFIC 90 to the antenna element ANT.

The radio-frequency front end circuit 80 includes a filter 50, a switch 60 that is directly or indirectly connected to the filter 50, an amplification circuit 70 that is directly or indirectly connected to the filter 50, and the amplification circuit 10 according to embodiment 1 that is directly or indirectly to the filter 50. Here, the switch 60 is directly connected to the filter 50 and the amplification circuits 10 and 70 are indirectly connected to the filter 50 via the switch 60.

The filter 50 is for example a filter whose pass band is a 5 GHz band. In the case where the radio-frequency front end circuit 80 includes the amplification circuit 15 rather than the amplification circuit 10, the filter 50 may be a filter having a pass band that is a 2.4 GHz band, for example.

The switch 60 is connected between the filter 50 and the amplification circuits 10 and 70 and the switch 60 switches between connecting the filter 50 and the amplification circuit 10 to each other and connecting the filter 50 and the amplification circuit 70 to each other in accordance with a control signal from a control unit (not illustrated). The switch 60 is controlled so that the filter 50 and the amplification circuit 70 are connected to each other when a radio-frequency signal is to be transmitted and so that the filter 50 and the amplification circuit 10 are connected to each other when a radio-frequency signal is to be received.

The amplification circuit 10 is an LNA that is connected to the filter 50 via the switch 60 and amplifies the power of a radio-frequency signal received by the antenna element ANT.

The amplification circuit 70 is a power amplifier (PA) that is connected to the filter 50 via the switch 60 and amplifies the power of a radio-frequency signal output from the RFIC 90.

The RFIC 90 is an RF signal processing circuit that processes radio-frequency signals transmitted and received by the antenna element ANT. Specifically, the RFIC 90 subjects a radio-frequency signal input thereto from the antenna element ANT via the radio-frequency front end circuit 80 to signal processing using down conversion and so forth and outputs a reception signal generated through this signal processing to a baseband signal processing circuit (not illustrated). In addition, the RFIC 90 subjects a transmission signal input thereto from the baseband signal processing circuit to signal processing using up conversion and so forth and outputs the radio-frequency signal generated through this signal processing to the radio-frequency front end circuit 80.

The control unit mentioned above is not illustrated in FIG. 5 but may be included in the RFIC 90 or may be included in a switch IC together with the switch 60.

The thus-configured radio-frequency front end circuit 80 and communication device 100 include the amplification circuit 10 according to embodiment 1, and can consequently effectively suppress input of an excessive voltage to an amplifier when where a step-up input matching network is used.

Other Embodiments

An amplification circuit, a radio-frequency front end circuit, and a communication device according to embodiments of the present disclosure have been described above, but the present disclosure is not limited to the above-described embodiments. Other embodiments realized by combining any of the constituent elements of the above-described embodiments with one another, modifications obtained by modifying the above-described embodiments in various ways, as thought of by one skilled in the art, without necessarily departing from the gist of the present disclosure, and various devices having an amplification circuit, a radio-frequency front end circuit, and a communication device according to embodiments of the present disclosure built thereinto are also included in the scope of the present disclosure.

For example, in the above-described embodiments, the input matching network 30 is implemented using the capacitor C2 and the inductor L1, but the input matching network 30 may instead be implemented by using another circuit configuration provided that the input matching network 30 is a circuit that converts an impedance from a low impedance to a high impedance.

Furthermore, for example, the bias voltage is supplied to the bias terminal (node N2) via the resistor R1 or an inductor in the above-described embodiments, but the bias voltage may instead be directly supplied to the bias terminal.

In addition, for example, the limit voltage of the limiter circuit 40 is greater than or equal to the bias voltage supplied to the bias terminal in the above-described embodiments, but the limit voltage may instead be less than the bias voltage.

Furthermore, for example, the bias voltage supplied to the bias terminal is variable in the above-described embodiments, but the bias voltage does not have to be variable. Specifically, although switching is performed between stopping and supplying of the bias voltage to the bias terminal, this switching does not have to be performed.

In addition, for example, the node N2 is a bias terminal in the above-described embodiments, but the node N2 does not have to be the bias terminal. In other words, the input matching network 30 does not have to double as a bias circuit.

Furthermore, for example, the resonant frequency of the series resonant circuit formed of the inductor L1 and the capacitor C3 is a frequency that is half that of the operation band of the amplification circuit 10 in the above-described embodiments, but the resonant frequency may instead be less than or equal to a frequency that is half that of the operation band.

In addition, for example, the resonant frequency of the series resonant circuit formed of the inductor L1 and the capacitor C3 is located at a lower frequency than the operation band of the amplification circuit 10 in the above-described embodiments, but may instead be located at a higher frequency than the operation band of the amplification circuit 10.

Furthermore, for example, the input matching network 30 includes the capacitor C3, but does not have to include the capacitor C3. In other words, the input matching network 30 does not have to double as a BEF.

The present disclosure can be widely utilized in communication devices such as a mobile phone as an amplification circuit that amplifies a radio-frequency signal and as a front end circuit and a communication device that include the amplification circuit.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. An amplification circuit comprising:
   an amplifier comprising a transistor that is connected between an input terminal and an output terminal;
   an input matching network that is connected between the input terminal and an input of the amplifier, and that is configured to convert a low impedance to a high impedance;
   a limiter circuit that is connected between ground and a node between the input matching network and the input of the amplifier, and that comprises two diodes connected in opposite directions in parallel with each other; and
   a first capacitor that is connected in series with the limiter circuit between the node and ground,
   wherein the node is on a signal path that connects the input matching network to the input of the amplifier,
   wherein the input matching network comprises:
      a second capacitor that is on a path connecting the input terminal and the node; and
      a first inductor that is connected between the path and ground, and
   wherein the input matching network further comprises a third capacitor that is connected in series with the first inductor between the first inductor and ground.

2. The amplification circuit according to claim 1, wherein a node between the first inductor and the third capacitor is a bias terminal.

3. The amplification circuit according to claim 2, wherein a bias voltage is supplied to the bias terminal via a resistor or inductor.

4. The amplification circuit according to claim 2, wherein a limit voltage of the limiter circuit is greater than or equal to a bias voltage supplied to the bias terminal.

5. The amplification circuit according to claim 2, wherein a bias voltage supplied to the bias terminal is variable.

6. The amplification circuit according to claim 1, wherein a resonant frequency of the first inductor and the third capacitor together is less than an operation frequency band of the amplification circuit.

7. The amplification circuit according to claim 6, wherein the resonant frequency is greater than half a frequency of the operation band.

8. The amplification circuit according to claim 1, further comprising:
   a parallel resonant circuit that is on a path connecting the input matching network and the node, and that comprises a second inductor and a fourth capacitor connected in parallel with each other.

9. A radio-frequency front end circuit comprising:
   a filter;
   a switch that is connected to the filter; and
   the amplification circuit according to claim 1 that is connected to the filter via the switch.

10. A communication device comprising:
    a radio-frequency (RF) signal processing circuit that is configured to process a radio-frequency signal transmitted or received by an antenna; and
    the radio-frequency front end circuit according to claim 9 that is configured to transmit the radio-frequency signal between the antenna and the RF signal processing circuit.

* * * * *